US011289477B2

(12) United States Patent
Duriez et al.

(10) Patent No.: US 11,289,477 B2
(45) Date of Patent: Mar. 29, 2022

(54) SEMICONDUCTOR STRUCTURE WITH LOW DEFECT

(71) Applicant: TAIWAN SEMICONDUCTOR MANUFACTURING CO., LTD., Hsinchu (TW)

(72) Inventors: Blandine Duriez, Brussels (BE); Georgios Vellianitis, Heverlee (BE)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 375 days.

(21) Appl. No.: 15/720,366

(22) Filed: Sep. 29, 2017

(65) Prior Publication Data

US 2018/0026034 A1    Jan. 25, 2018

Related U.S. Application Data

(62) Division of application No. 15/063,022, filed on Mar. 7, 2016, now Pat. No. 9,806,077.

(51) Int. Cl.

| | |
|---|---|
| H01L 27/088 | (2006.01) |
| H01L 29/78 | (2006.01) |
| H01L 29/66 | (2006.01) |
| H01L 29/06 | (2006.01) |
| H01L 21/311 | (2006.01) |
| H01L 29/786 | (2006.01) |
| H01L 29/423 | (2006.01) |

(52) U.S. Cl.
CPC .... *H01L 27/0886* (2013.01); *H01L 21/31111* (2013.01); *H01L 29/0649* (2013.01); *H01L 29/0673* (2013.01); *H01L 29/42392* (2013.01); *H01L 29/6656* (2013.01); *H01L 29/66545* (2013.01); *H01L 29/66795* (2013.01); *H01L 29/785* (2013.01); *H01L 29/78696* (2013.01)

(58) Field of Classification Search
CPC .................................. H01L 29/42372
See application file for complete search history.

(56) References Cited

U.S. PATENT DOCUMENTS

| | | | |
|---|---|---|---|
| 2011/0095267 A1* | 4/2011 | Bryant | B82Y 10/00 257/24 |
| 2013/0026451 A1* | 1/2013 | Bangsaruntip | H01L 29/66772 257/24 |
| 2015/0053928 A1 | 2/2015 | Ching et al. | |
| 2015/0102287 A1 | 4/2015 | Wang et al. | |
| 2015/0263094 A1 | 9/2015 | Diaz et al. | |

OTHER PUBLICATIONS

Wang et al., "High quality Ge epitaxial layers in narrow channels on Si (001) substrates", Applied Physics Letters, 2010, vol. 96, pp. 111903-1-111903-3.

* cited by examiner

*Primary Examiner* — Kenneth Parker
*Assistant Examiner* — Christopher A Culbert
(74) *Attorney, Agent, or Firm* — Birch, Stewart, Kolasch & Birch, LLP

(57) ABSTRACT

Semiconductor structures are provided. The semiconductor structure includes a fin structure formed over a substrate and an isolation structure formed around the fin structure. The semiconductor structure further includes a nanowire structure formed over the fin structure and a gate structure formed around the nanowire structure. In addition, a bottommost of the nanowire structure is lower than a top surface of the isolation structure.

20 Claims, 23 Drawing Sheets

SEMICONDUCTOR STRUCTURE WITH LOW DEFECT

CROSS REFERENCE TO RELATED APPLICATIONS

This application is a Divisional application of U.S. patent application Ser. No. 15/063,022, filed on Mar. 7, 2016, the entire of which is incorporated by reference herein.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers over a semiconductor substrate and patterning the various material layers using lithography to form circuit components and elements thereon.

One of the important drivers for improving performance in semiconductor structures is the higher levels of integration of circuits. This is accomplished by miniaturizing or shrinking device sizes on a given chip. For example, FinFET structures and nanowire FET structures are formed to increase the integration density in the semiconductor structures. However, although existing processes for manufacturing FinFET structures and nanowire FET structures have generally been adequate for their intended purposes, as device scaling-down continues, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
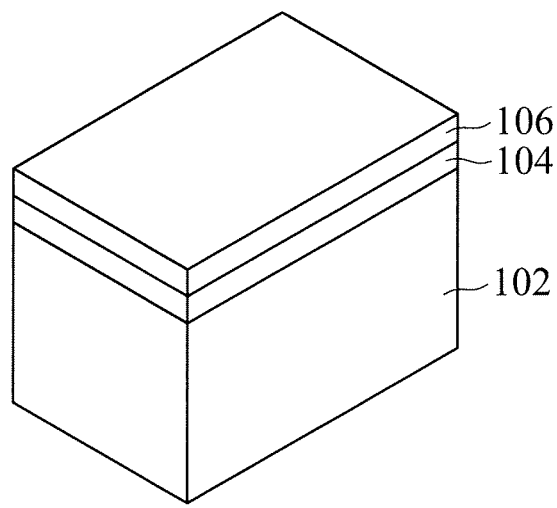
FIGS. 1A to 1P are perspective representations of various stages of forming a semiconductor structure in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of semiconductor structures and methods for forming the same are provided. The method for forming a semiconductor structure may include reflowing a semiconductor material in a trench to form a cavity under the semiconductor material. The semiconductor material located over the cavity may be used as a nanowire structure and may have fewer defects.

Figure 1B:
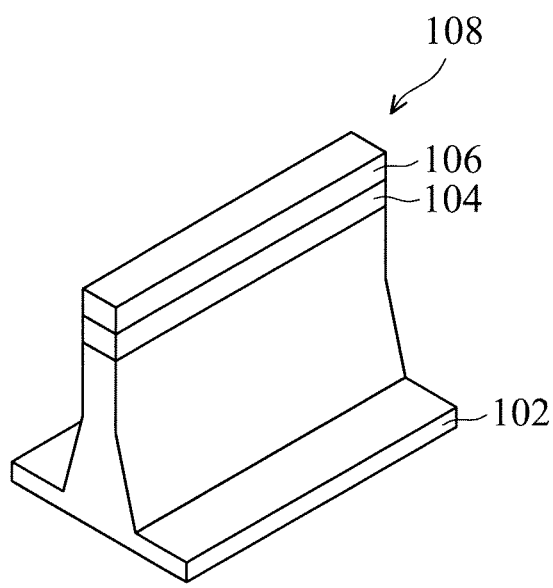
Figure 1C:
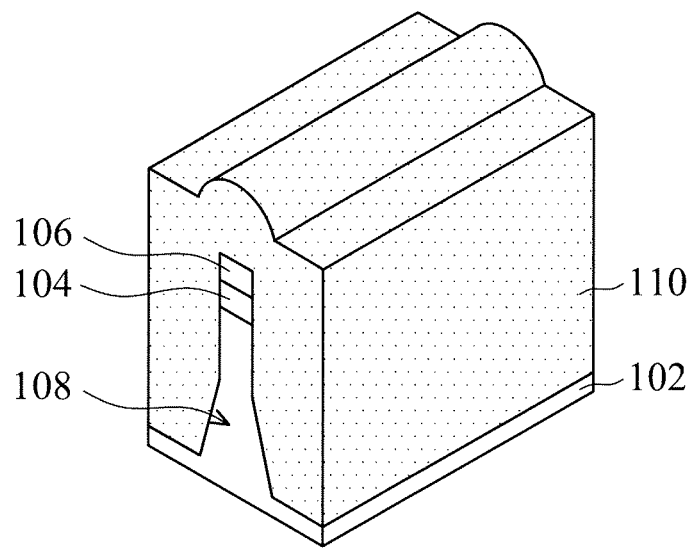
Figure 1D:
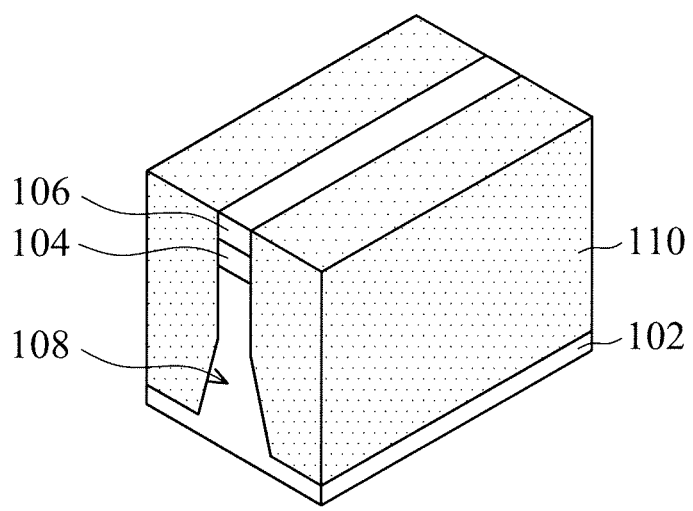
Figure 1E:
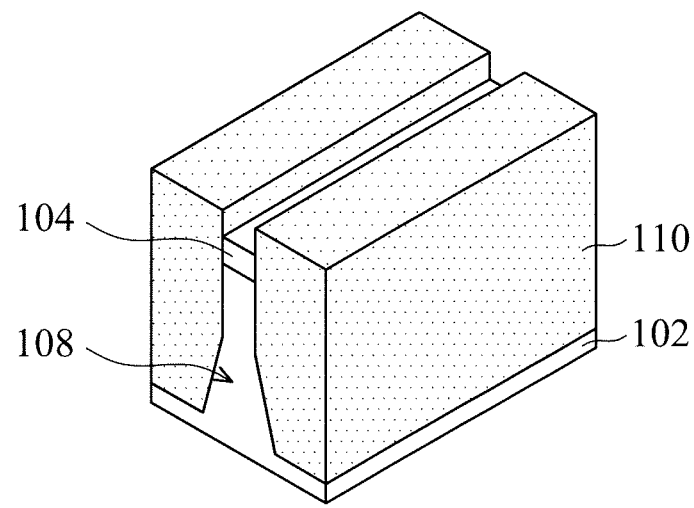
Figure 1F:
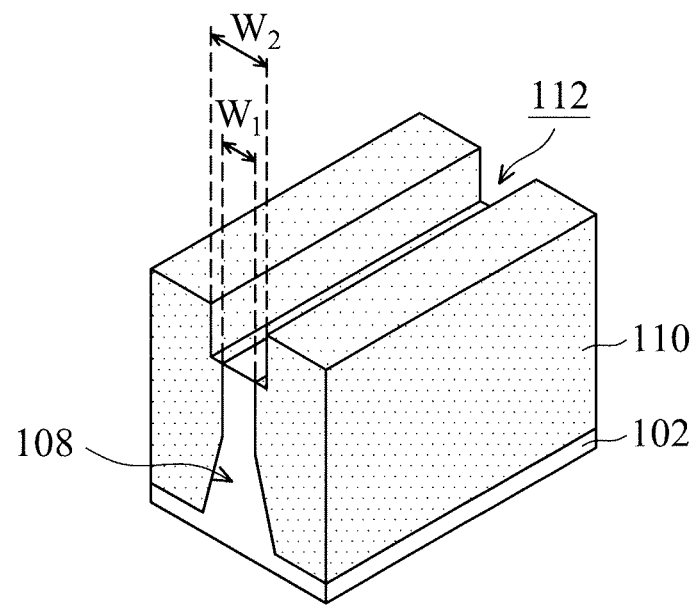
Figure 1G:
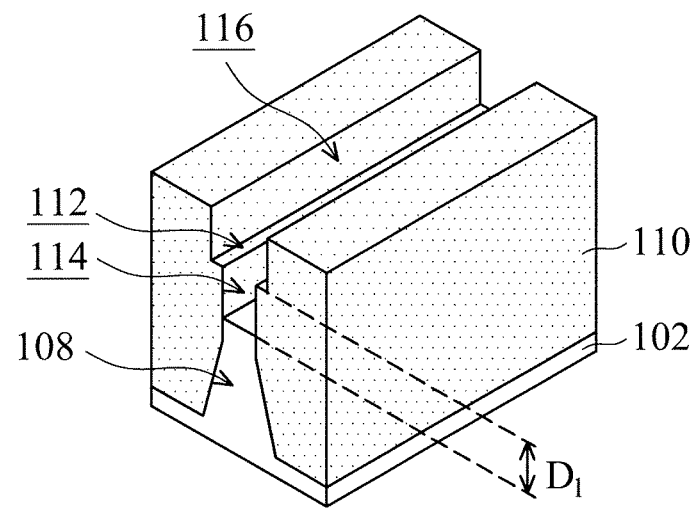
Figure 1H:
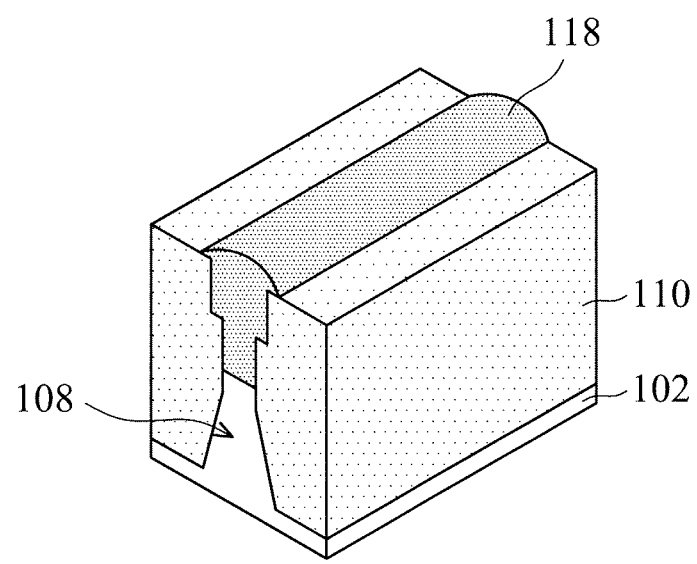
Figure 1I:
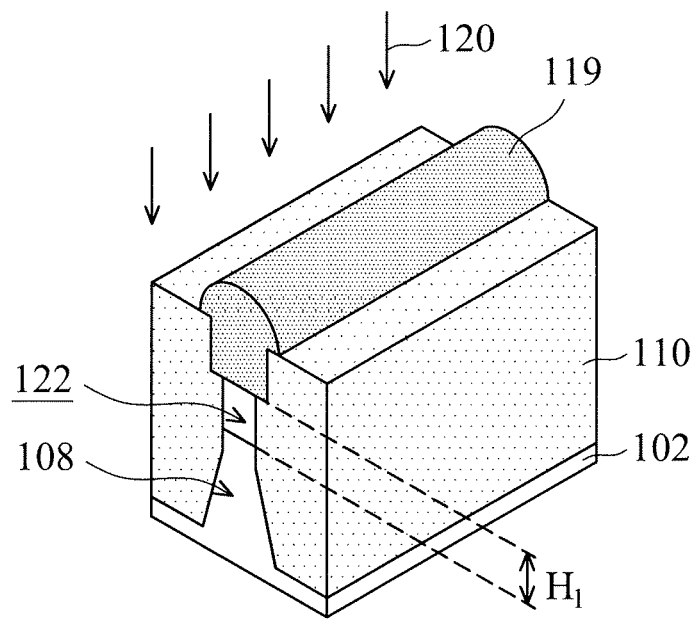
Figure 1J:
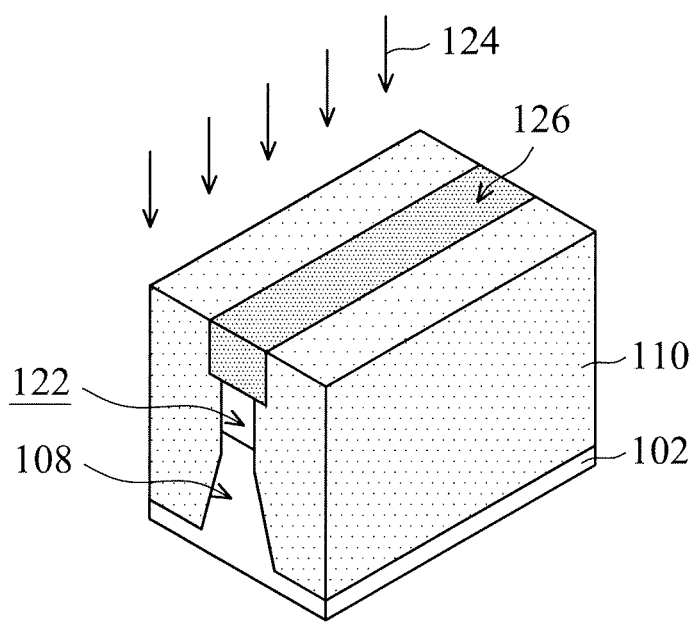
Figure 1K:
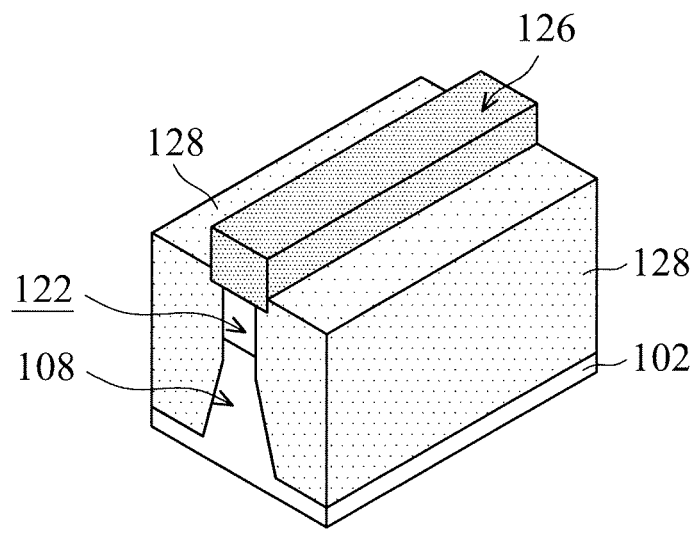
Figure 1L:
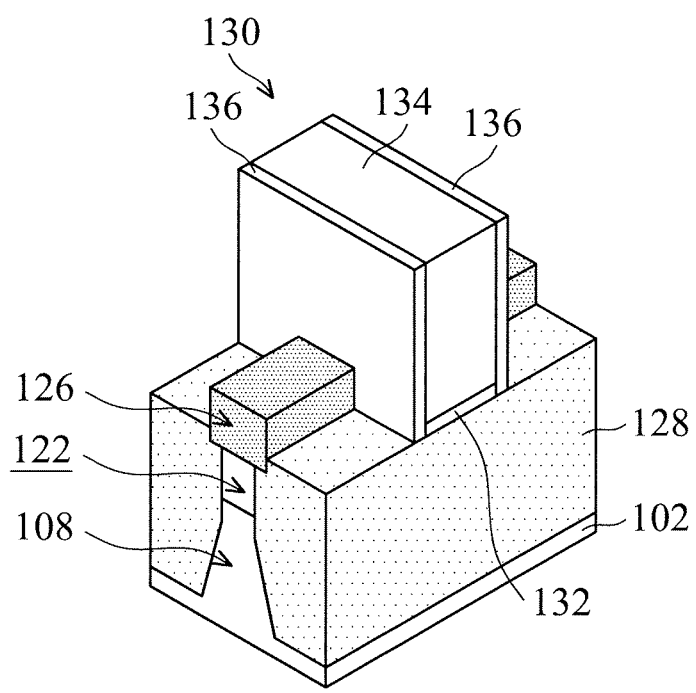
Figure 1M:
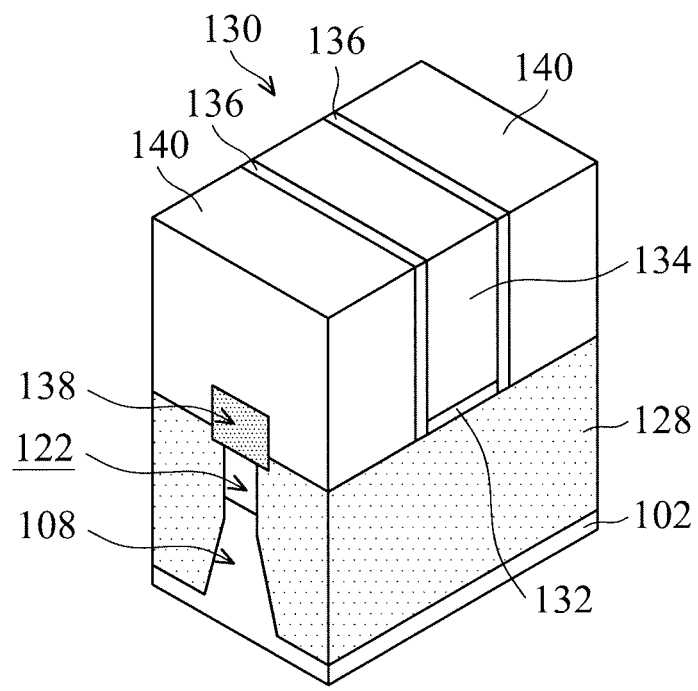
Figure 1N:
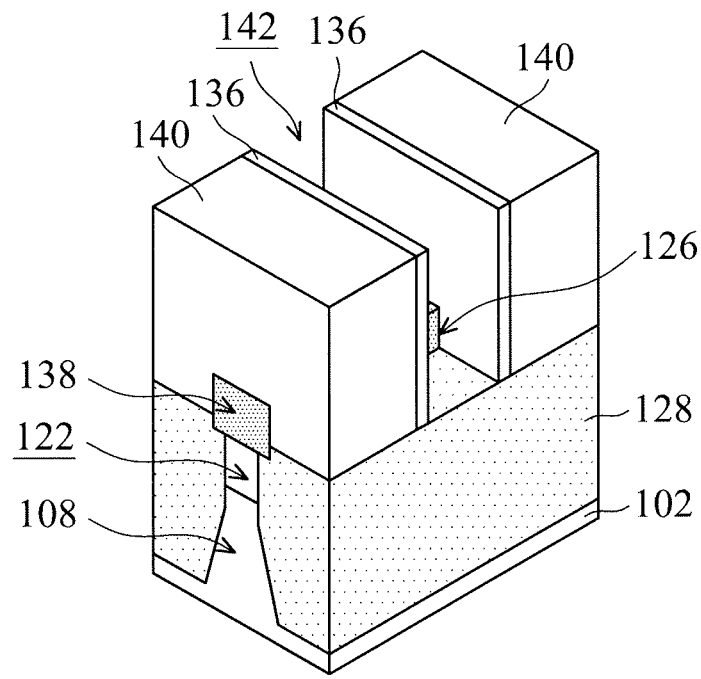
Figure 1O:
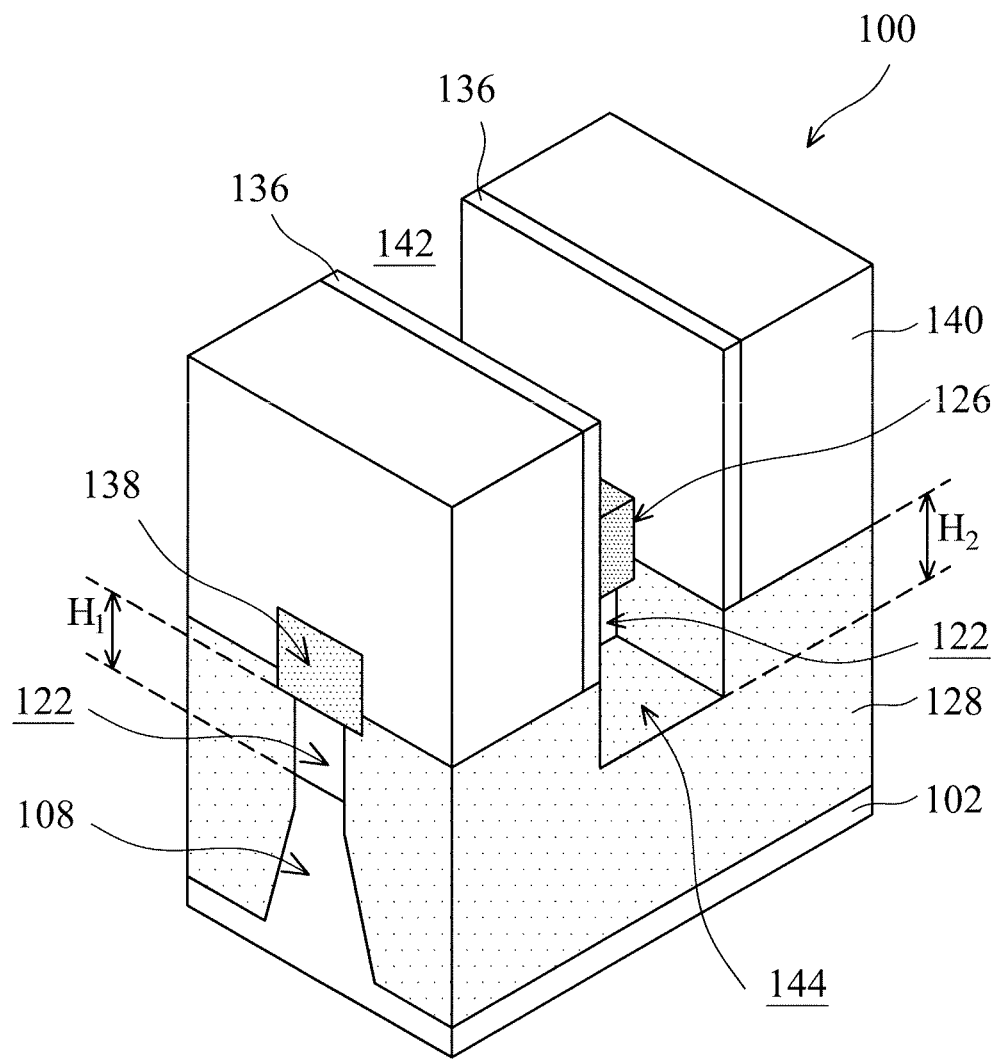
Figure 1P:
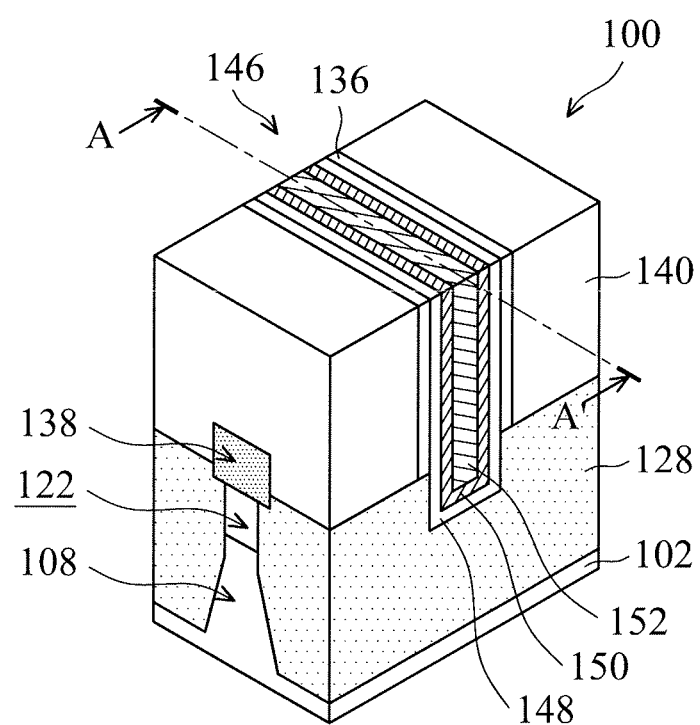

FIGS. 1A to 1P are perspective representations of various stages of forming a semiconductor structure 100 in accordance with some embodiments. As shown in FIG. 1A, a substrate 102 is received in accordance with some embodiments. The substrate 102 may be a semiconductor wafer such as a silicon wafer. Alternatively or additionally, the substrate 102 may include elementary semiconductor materials, compound semiconductor materials, and/or alloy semiconductor materials. Examples of the elementary semiconductor materials may be, but are not limited to, crystal silicon, polycrystalline silicon, amorphous silicon, germanium, and/or diamond. Examples of the compound semiconductor materials may be, but are not limited to, silicon carbide, gallium arsenic, gallium phosphide, indium phosphide, indium arsenide, and/or indium antimonide. Examples of the alloy semiconductor materials may be, but are not limited to, SiGe, GaAsP, AlInAs, AlGaAs, GaInAs, GaInP, and/or GaInAsP.

In addition, the substrate 102 may include structures such as doped regions, interlayer dielectric (ILD) layers, conductive features, and/or isolation structures. Furthermore, the substrate 102 may further include single or multiple material layers to be patterned. For example, the material layers may include a silicon layer, a dielectric layer, and/or a doped poly-silicon layer. In some embodiments, the substrate 102 is a silicon substrate. In some embodiments, the substrate 102 is a silicon-on-insulator (SOI) substrate.

An oxide layer 104 and a nitride layer 106 are formed over the substrate 102, as shown in FIG. 1A in accordance with some embodiments. In some embodiments, the oxide layer 104 is made of silicon oxide. The oxide layer 104 may be formed by using a thermal oxidation process, although other deposition processes may be used in some other embodiments.

The nitride layer 106 may be used as a hard mask during subsequent photolithography processes. In some embodiments, the nitride layer 106 is made of silicon nitride. The nitride layer 106 may be formed by using low-pressure chemical vapor deposition (LPCVD) or plasma enhanced chemical vapor deposition (PECVD), although other deposition processes may also be used in some other embodiments.

Next, a fin structure 108 is formed from the nitride layer 106, the oxide layer 104, and the substrate 102, as shown in FIG. 1B in accordance with some embodiments. In some embodiments, the nitride layer 106, the oxide layer 104, and the substrate 102 are sequentially patterned to form the fin structure 108. In some embodiments, the nitride layer 106, the oxide layer 104, and the substrate 102 are patterned by forming a photoresist layer over the nitride layer 108, and etching the nitride layer 106, the oxide layer 104, and the substrate 102 through the photoresist layer.

After the fin structure 108 is formed, an insulating layer 110 is formed over the substrate 102, as shown in FIG. 1C in accordance with some embodiments. In addition, the insulating layer 110 is formed around the fin structure 108 and also covers the fin structure 108. In some embodiments, the insulating layer 110 is made of silicon oxide. The insulating layer 110 may be formed by using a high-density-plasma (HDP) CVD process, although other deposition processes may be used in other embodiments.

After the insulating layer 110 is formed, a polishing process is performed to remove the top portion of the insulating layer 110, as shown in FIG. 1D in accordance with some embodiments. In some embodiments, the polishing process is a chemical mechanical polishing (CMP) process. The polishing process may be performed until the top surface of the nitride layer 106 is exposed.

Afterwards, the nitride layer 106 is removed, as shown in FIG. 1G in accordance with some embodiments. The nitride layer 106 may be removed by performing a wet etching process or a dry etching process.

After the nitride layer 106 is removed, a trench 112 is formed in the insulating layer 110, as shown in FIG. 1F in accordance with some embodiments. In some embodiments, the trench 112 is formed by removing the oxide layer 104 and some portions of the insulating layer 110. In some embodiments, a hard mask structure having an opening may be formed over the insulating layer 110, and an etching process is performed through the opening to remove the oxide layer 104 and the portions of the insulating layer 110 exposed by the opening.

As shown in FIG. 1F, the fin structure 108 has a first width $W_1$ and the trench 112 has a second width $W_2$. In some embodiments, the second width $W_2$ is greater than the first width $W_1$. In some embodiments, the first width $W_1$ is in a range from about 5 nm to about 10 nm. In some embodiments, the second width $W_2$ is in a range from about 10 nm to about 20 nm. The size of the nanowire structure formed in subsequent processes may be controlled by adjusting the second width $W_2$ of the trench 112 (Details will be described later.)

After the trench 112 is formed, the top portion of the fin structure 108 is removed to form a trench 114, as shown in FIG. 1G in accordance with some embodiments. In some embodiments, the trench 114 is formed by etching the top portion of the fin structure 108 through the trench 112. As shown in FIG. 1G, although the top portion of the fin structure 108 is removed, the bottom portion of the fin structure 108 remains.

In some embodiments, the trench 114 has a depth $D_1$, which is smaller than the thickness of the insulating layer 110 at this stage. In some embodiments, the depth $D_1$ is in a range from about 50 nm to about 300 nm. The depth $D_1$ of the trench 114 may determine the size of the cavity formed in subsequent processes and may be adjusted according to its application (Details will be described later.)

As described previously, the trench 114 may be formed through the trench 112, and therefore the trench 114 connects to the trench 112. That is, the trench 112 and the trench 114 may be seen as a trench 116 having a wider top portion (e.g. the trench 112) and a narrower bottom portion (e.g. the trench 114.)

After the trench 116 is formed, a semiconductor material 118 is formed in the trench 116, as shown in FIG. 1H in accordance with some embodiments. As shown in FIG. 1H, the trench 116, including the trench 112 and the trench 114, is completely filled with the semiconductor material 118 in accordance with some embodiments. In addition, the semiconductor material 118 is formed on the fin structure 108 and is in direct contact with the top surface of the fin structure 108 at this stage. It should be noted that the amount of semiconductor material 118 may be adjusted as required. For example, the trench 116 may only be partially filled with the semiconductor material 118 or may be over-filled with the semiconductor material 118.

In some embodiments, the semiconductor material is Ge, Si, SiGe, or the like. In some embodiments, the semiconductor material 118 is formed by performing an epitaxial growth process.

Next, the semiconductor material 118 is reflowed by performing an annealing process 120, as shown in FIG. 1I in accordance with some embodiments. The condition of the annealing process 120 may be adjusted depending on the semiconductor material 118 which needs to be reflowed in the process. In some embodiments, the annealing process 120 is a laser annealing process and is performed at a temperature in a range from about 900° C. to about 1000° C. In some embodiments, the annealing process 120 is a rapid thermal annealing (RTA) process and is performed at a temperature in a range from about 700° C. to about 900° C. in $N_2$ or $H_2$ for few minutes.

During the annealing process 120, the dislocation in the semiconductor material 118 will move to reach the surface and disappear because of the thermal budget, so that the reflowed semiconductor material 119 can have fewer defects. In addition, as shown in FIG. 1I, during the annealing process 120, a portion of the semiconductor material 118 migrates from the bottom portion of the trench 116 to the top portion of the trench 116. Accordingly, a cavity 122 is formed at the bottom portion of the trench 116 under the reflowed semiconductor material 119, as shown in FIG. 1I in accordance with some embodiments.

In some embodiments, the cavity 122 has a height $H_1$, which is substantially equal to the depth $D_1$ of the trench 114. That is, after the annealing process 120 is performed, the reflowed semiconductor material 119 is mainly located in the top portion of the trench 116 (e.g. the trench 112), so that the cavity 122 is formed at the bottom portion of the trench 116 (e.g. the trench 114.) However, it should be noted that the cavity 122 shown in FIG. 1I is merely an example, and the size of the cavity 122 may be adjusted according to its application.

In some embodiments, the height $H_1$ of the cavity 122 is in a range of about 50 nm to about 300 nm. The size of the cavity 122 (e.g. the height $H_1$ of the cavity 122) should be large enough so that a portion of the gate structure may be formed in a portion of the cavity 122 in subsequent processes. On the other hand, if the size of the cavity 122 is too large, a great amount of reflowed semiconductor material 119 may flow onto the top surface of the insulating layer 110, such that there is not enough of the reflowed semiconductor material 119 left in the trench 116 (Details will be described later.)

The size of the cavity 122 may be controlled by adjusting the condition of the annealing process 120. For example, the longer time and/or the higher temperature of the annealing process 120, the greater the size of the cavity 122. Therefore, the conditions of the annealing process 120 may be controlled to give sufficient energy to the semiconductor material 118 for the semiconductor material 118 to be reflowed to form the cavity 122, while ensuring that there is enough of the reflowed semiconductor material 119 left in the trench 116.

As shown in FIG. 1I, a portion of the reflowed semiconductor material 119 flows onto the top surface of the insulating layer 110 in accordance with some embodiments. Therefore, a polishing process 124 is performed to remove the portion of the reflowed semiconductor material 119 over the insulating layer 110 to form a nanowire structure 126, as shown in FIG. 1J in accordance with some embodiments.

More specifically, the polishing process 124 is performed to remove the portion of the reflowed semiconductor material 119 formed over the insulating layer 110. The polishing process 124 may be performed until the top surface of the insulating layer 110 is exposed. It should be noted that, although the polishing process 124 is shown in FIG. 1J, it may be omitted in some other embodiments, and the scope of the disclosure is not intended to be limiting.

After the nanowire structure 126 is formed, the insulating layer 110 is recessed to expose the upper portion of the nanowire structure 126, as shown in FIG. 1K in accordance with some embodiments. In some embodiments, the insulating layer 110 is recessed by performing an etching process. In some embodiments, the insulating layer 110 is recessed until most, but not all, of the nanowire structure 126 is exposed.

As shown in FIG. 1K, the insulating layer 110 is recessed to form an isolation structure 128, and a bottom portion of the nanowire structure 126 is embedded in the isolation structure 128. In addition, the cavity 122 is located in the isolation structure 128, and the nanowire structure 126 and the fin structure 108 are separated by the cavity 122.

Afterwards, a dummy gate structure 130 is formed across the upper portion of the nanowire structure 126 and extends over the isolation structure 128, as shown in FIG. 1L in accordance with some embodiments. In some embodiments, the dummy gate structure includes a dummy gate dielectric layer 132 and a dummy gate electrode layer 134 formed over the dummy gate dielectric layer 132. In some embodiments, the dummy gate dielectric layer 132 is made of silicon oxide. In some embodiments, the dummy gate electrode layer 134 is made of polysilicon.

Spacers 136 are formed on the sidewalls of the dummy gate structure 130 in accordance with some embodiments. In some embodiments, the spacers 136 are made of silicon nitride, silicon oxide, silicon oxynitride, silicon carbide, or other applicable dielectric materials.

After the dummy gate structure 130 is formed, source/drain regions 138 are formed in two ends of the nanowire structure 126, although only one is shown in FIG. 1M in accordance with some embodiments. The source/drain regions 138 may be formed by doping n-type and/or p-type dopants in the nanowire structure 126. As shown in FIG. 1M, the source/drain regions 138 are located over some portions of the cavity 122.

After the source/drain regions 138 are formed, a material layer 140 is formed to cover the source/drain regions 138, and a polishing process is performed on the material layer 140 to expose the top surface of the dummy gate structure 130. In some embodiments, the material layer 140 is epitaxial growth of Si or SiGe or Ge, which is used as source and drain contact regions. In some embodiments, SiP is used for n-channel transistors, and SiGeB is used for p-channel transistors. In some embodiments, the material layer 140 is planarized by performing a chemical mechanical polishing (CMP) process until the top surface of the dummy gate structure 130 is exposed.

After the polishing process is performed, the dummy gate structure 130 is removed to form a gate trench 142 between the spacers 136, as shown in FIG. 1N in accordance with some embodiments. As shown in FIG. 1N, the upper portion of the nanowire structure 126 is exposed in the gate trench 142 after the dummy gate structure 130 is removed.

After the dummy gate structure 130 is removed, a portion of the isolation structure 128 is removed to expose a portion of the cavity 122, as shown in FIG. 1O in accordance with some embodiments. In some embodiments, the portion of the isolation structure 128 is removed by etching the isolation structure 128 through the gate trench 142, such that the gate trench 142 has an extending portion 144 extending into the isolation structure 128.

As shown in FIG. 1O, the extending portion 144 of the gate trench 142 has a height $H_2$. In some embodiments, the height $H_2$ of the extending portion 144 is smaller than the height $H_1$ of the cavity 122, such that only a portion of the cavity 122 is exposed in the extending portion 144 of the gate trench 142. In some embodiments, the height $H_2$ of the extending portion 144 is substantially equal to, or larger than, the height $H_1$ of the cavity 122, such that the cavity 122 is completely exposed in the extending portion 144 of the gate trench 142.

Afterwards, a gate structure 146 is formed in the gate trench 142 and the extending portion 144, as shown in FIG. 1P in accordance with some embodiments. In some embodiments, a portion of the gate structure 146 is formed in the cavity 122 located below the nanowire structure 126, such that a portion of the nanowire structure 126 is surrounded by the gate structure 146. In addition, a portion of the gate structure 146 is formed in the extending portion 144 of the gate trench 142, such that the portion of the gate structure 146 extends into the isolation structure 128.

In some embodiments, the gate structure 146 includes a gate dielectric layer 148, a work function metal layer 150, and a metal gate electrode layer 152. In some embodiments, the gate dielectric layer 128 is made of metal oxides, metal nitrides, metal silicates, transition metal oxides, transition metal nitrides, transition metal silicates, oxynitrides of metals, metal aluminates, or other high-k dielectric materials. Examples of the high-k dielectric material may include, but are not limited to, hafnium oxide ($HfO_2$), hafnium silicon oxide ($HfSiO_2$), hafnium silicon oxynitride (HfSiON), hafnium tantalum oxide ($HfTaO_2$), hafnium titanium oxide (HfTiO$_2$), hafnium zirconium oxide (HfZrO$_2$), zirconium silicate, zirconium aluminate, zirconium oxide, titanium oxide, aluminum oxide, or hafnium dioxide-alumina (HfO$_2$—Al$_2$O$_3$) alloy.

The work function metal layer 150 is formed over the gate dielectric layer 148 in accordance with some embodiments. The work function metal layer 150 may be customized to have the proper work function. For example, if P-type work function metal (P-metal) for a PMOS device is desired, Pt, Ta, Re, N+-polysilicon, TiN, WN, or W may be used. On the other hand, if an N-type work function metal (N-metal) for NMOS devices is desired, Al, P+ polysilicon, Ti, V, Cr, Mn, TiAl, TiAlN, TaN, TaSiN or TaCN, may be used.

The metal gate electrode layer 152 is formed over the work function metal layer 150 in accordance with some embodiments. In some embodiments, the metal gate electrode layer 152 is made of a conductive material, such as aluminum, copper, tungsten, titanium, tantalum, titanium nitride, tantalum nitride, nickel silicide, cobalt silicide, TaC, TaSiN, TaCN, TiAl, TiAlN, or other applicable materials. The gate dielectric layer 148, the work function metal layer 150, and the metal gate electrode layer 152 may be formed by any applicable process and have any applicable thicknesses.

It should be noted that additional layers may be formed above and/or below the gate dielectric layer 148, the work function metal layer 150, and the metal gate electrode layer 152, such as liner layers, interface layers, seed layers, adhesion layers, barrier layers, or the like. In addition, the gate dielectric layer 148, the work function metal layer 150, and the metal gate electrode layer 152 may include one or more materials and/or one or more layers.

FIGS. 2A to 2H are cross-sectional representations of the semiconductor structures 100a to 100g shown along line A-A' as shown in FIG. 1P in accordance with various embodiments. More specifically, FIGS. 2A to 2D show possible cross-sectional representations of semiconductor structures 100a to 100d, in which the height H$_2$ of the extending portion 144 is smaller than the height H$_1$ of the cavity 122 shown in FIG. 1O.

Figure 2A:
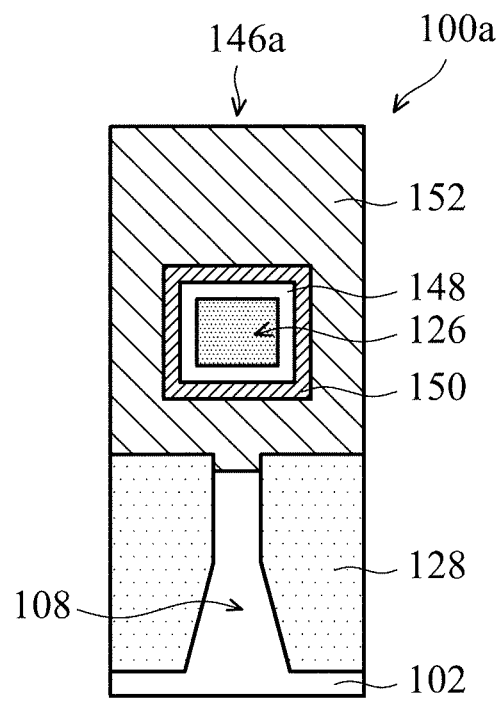
FIGS. 2A to 2H are cross-sectional representations of the semiconductor structures shown along line A-A' as shown in FIG. 1P in accordance with various embodiments.

As shown in FIG. 2A, since the height H$_2$ of the extending portion 144 is smaller than the height H$_1$ of the cavity 122, the top surface of the isolation structure 128 under gate structures 146a is higher than the top surface of the fin structure 108. In addition, the nanowire structure 126 is surrounded by the gate structure 146a, including the gate dielectric layer 148, the work function metal layer 150, and the gate electrode layer 152.

Similar to that of the semiconductor structure 100a, in the semiconductor structure 100b, the top surface of the isolation structure 128 under gate structures 146b is higher than the top surface of the fin structure 108. However, the gate electrode layer 152 is not formed under the nanowire structure 126. That is, when the gate structure 146b is formed, only the gate dielectric layer 148 and the work function metal layer 150 are formed in the cavity 122 under the nanowire structure 126 but the gate electrode layer 152 is not formed in the cavity 122.

The semiconductor structure 100c may be similar to the semiconductor structure 100a shown in FIG. 2A, except a portion of the cavity 122 remains under a gate structure 146c. That is, a portion of the gate structure 146c, including the gate dielectric layer 148, the work function metal layer 150, and the gate electrode layer 152, are formed in the cavity 122 under the nanowire structure 126. However, the cavity 122 is not completely filled with the gate structure 146c. Therefore, a portion of the cavity 122 is located under the gate structure 146c in the semiconductor structure 100c.

Figure 2B:
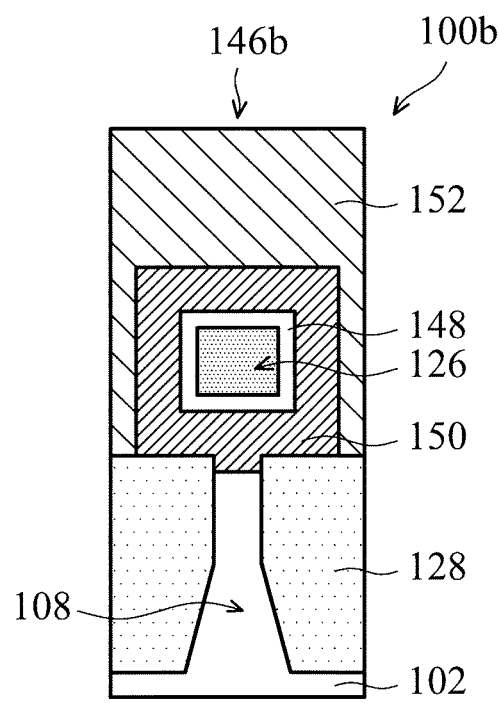
Figure 2C:
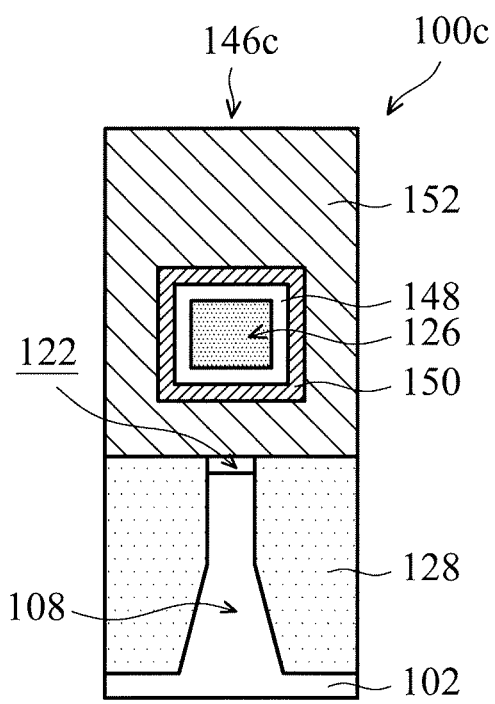
Figure 2D:
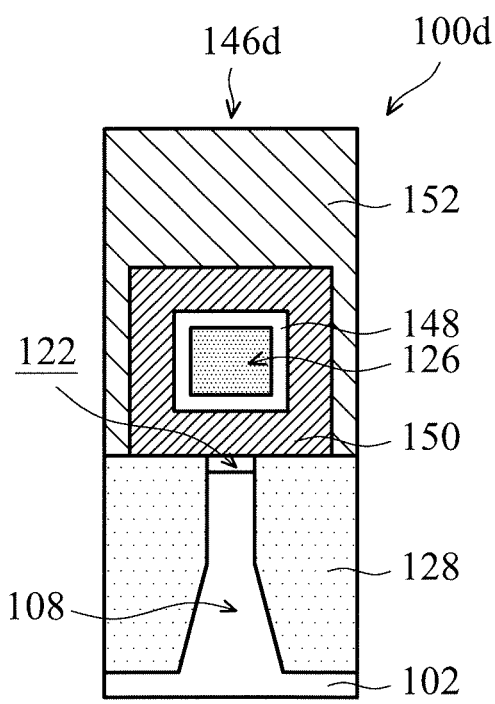

The semiconductor structure 100d may be similar to the semiconductor structure 100b shown in FIG. 2B, except a portion of the cavity 122 is not filled. As shown in FIG. 2D, a portion of the gate structure 146d, including the gate dielectric layer 148 and the work function metal layer 150 but not including the gate electrode layer 152, is formed in the cavity 122 under the nanowire structure 126. However, the cavity 122 is not completely filled with the gate structure 146d. Therefore, a portion of the cavity 122 is located under the gate structure 146d in the semiconductor structure 100d.

Figure 2E:
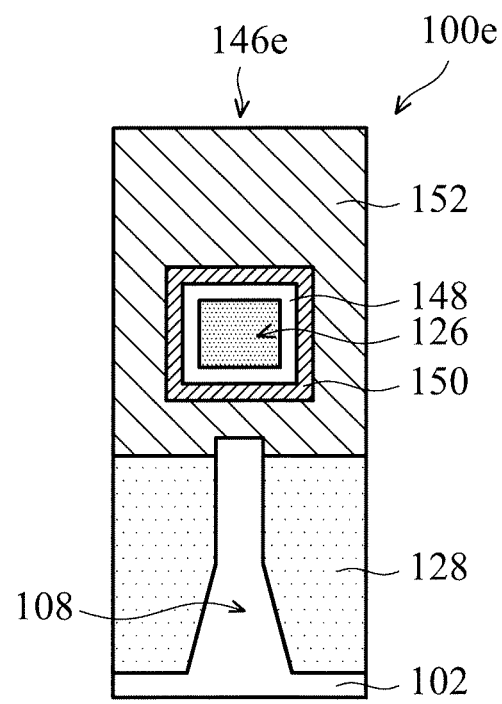
Figure 2F:
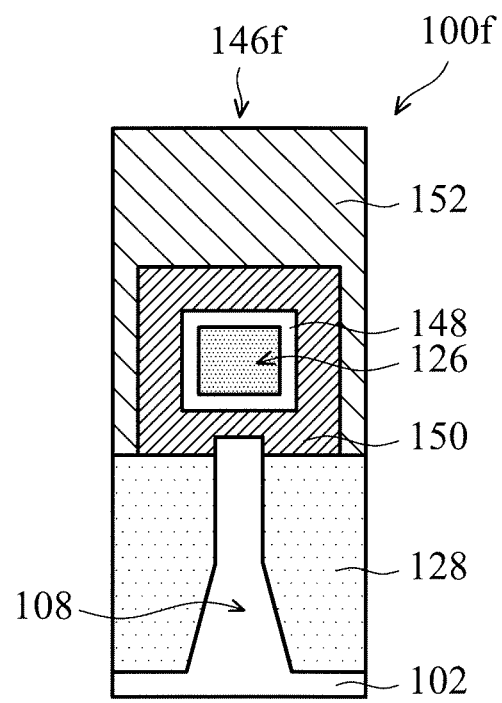

FIGS. 2E and 2F show possible cross-sectional representations of semiconductor structures 100e and 100f, in which the height H$_2$ of the extending portion 144 is greater than the height H$_1$ of the cavity 122 shown in FIG. 1O.

The semiconductor structure 100e may be similar to the semiconductor structure 100a shown in FIG. 2A, except that the top surface of the isolation structure 128 under gate structures 146e is lower than the top surface of the fin structure 108. That is, a portion of the fin structure 108 extends into the gate structure 146e (e.g. a portion of the gate electrode layer 152) in accordance with some embodiments.

The semiconductor structure 100f may be similar to the semiconductor structure 100b shown in FIG. 2B, except that the top surface of the isolation structure 128 under gate structures 146e is lower than the top surface of the fin structure 108. That is, a portion of the fin structure 108 extends into the gate structure 146f (e.g. a portion of the work function metal layer 148) in accordance with some embodiments.

Figure 2G:
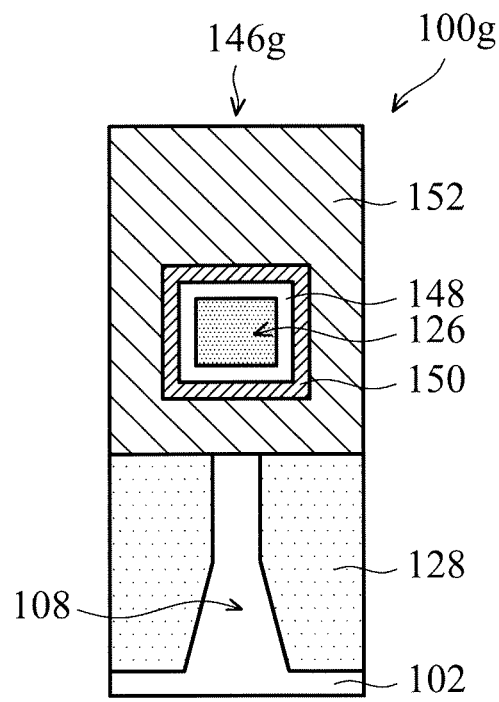
Figure 2H:
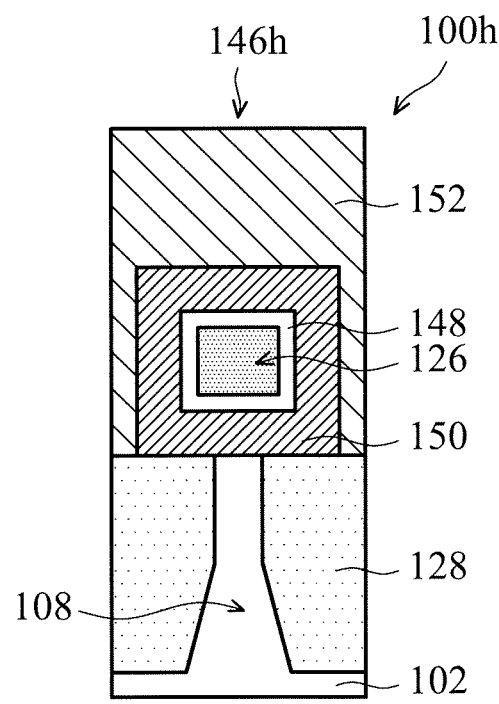

FIGS. 2G and 2H show possible cross-sectional representations of semiconductor structures 100g and 100h, in which the height H$_2$ of the extending portion 144 is substantially equal to the height H$_1$ of the cavity 122 shown in FIG. 1O.

The semiconductor structures 100g and 100h may be similar to the semiconductor structures 100a and 100b shown in FIGS. 2A and 2B, except that the top surface of the isolation structure 128 under gate structures 146e and 146g are substantially level with the top surface of the fin structure 108 in accordance with some embodiments.

It should be noted that cross-sectional representations shown in FIGS. 2A to 2H are merely examples for better understanding the concept of the disclosure, and the scope of the disclosure is not intended to be limiting.

FIGS. 3A to 3D are perspective representations of various stages of forming a semiconductor structure 100' in accordance with some embodiments. The semiconductor structure 100' is similar to the semiconductor structure 100 described previously, except its nanowire structure 126' has a narrow bottom portion 127' in accordance with some embodiments. Some processes and materials used to form the semiconductor structure 100' may be similar to, or the same as, those used to form the semiconductor structure 100 shown in FIGS. 1A to 1P and are not repeated herein.

More specifically, the processes shown in FIGS. 1A to 1H may be performed to form a semiconductor material (e.g. the semiconductor material 118 as shown in FIG. 1H) in a trench (e.g. the trench 116 as shown in FIG. 1G). After the trench, including a wide top portion (e.g. the trench 112 as shown in FIG. 1G) and a narrow bottom portion (e.g. the trench 114 as shown in FIG. 1G), is fully filled with the semiconductor material, an annealing process 120' is performed to reflow the semiconductor material.

Figure 3A:
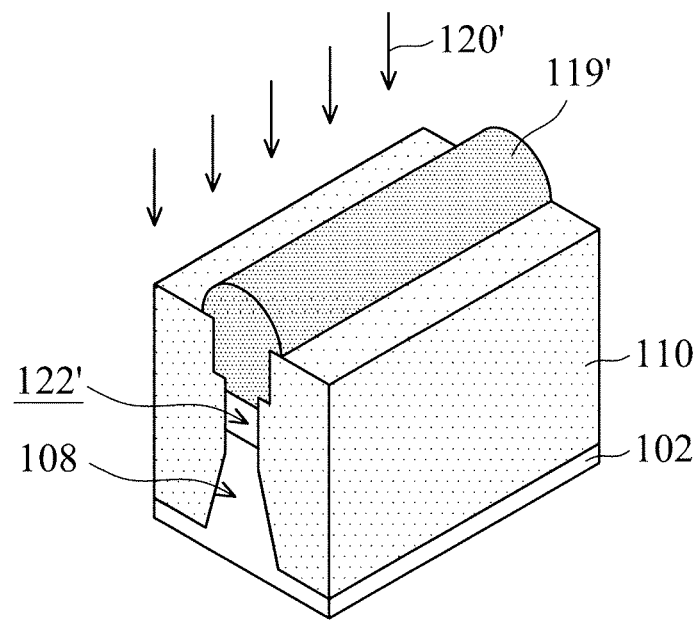
FIGS. 3A to 3D are perspective representations of various stages of forming a semiconductor structure in accordance with some embodiments.

The annealing process 120' may be similar to, or the same as, the annealing process 120 and is not repeated herein. As described previously, after the annealing process 120' is performed, the reflowed semiconductor material 119 will have fewer defects therein, and a cavity 122' is formed under the reflowed semiconductor material 119, as shown in FIG. 3A in accordance with some embodiments.

In addition, after the annealing process 120', the reflowed semiconductor material 119' is not only in the top portion of the trench but also in a portion of the bottom of the trench, such that the reflowed semiconductor material 119' has a narrower bottom portion 127' extending to the bottom portion of the trench. However, although the bottom portion 127' extends to a portion of the bottom portion of the trench, the reflowed semiconductor material 119' and the fin structure 108 are still separated by the cavity 122'.

Figure 3B:
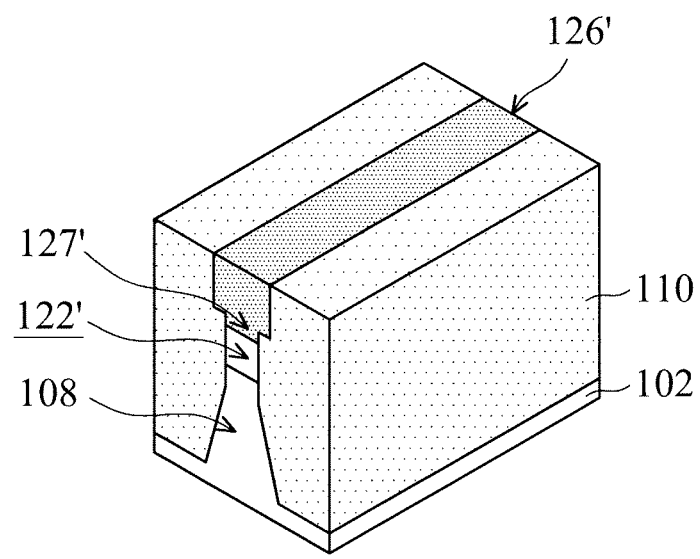

After the cavity 122' is formed, the processes shown in FIGS. 1J to 1P may be performed. For example, a polishing process may be performed to remove an additional portion of the reflowed semiconductor material 119' to form a nanowire structure 126', as shown in FIG. 3B in accordance with some embodiments.

Figure 3C:
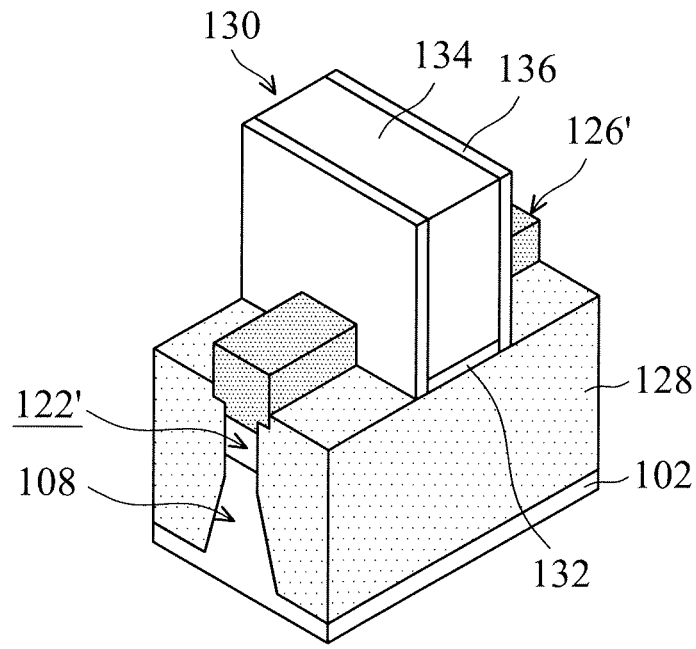

After the nanowire structure 126' is formed, the insulating layer 110 is recessed to form the isolation structure 128, and the dummy gate structure 130 is formed across the nanowire structure 126', as shown in FIG. 3C in accordance with some embodiments. The dummy gate structure 130 may also include the dummy gate dielectric layer 132 and the dummy gate electrode layer 134, and the spacers 136 are formed on the sidewalls of the dummy gate structure 130.

Figure 3D:
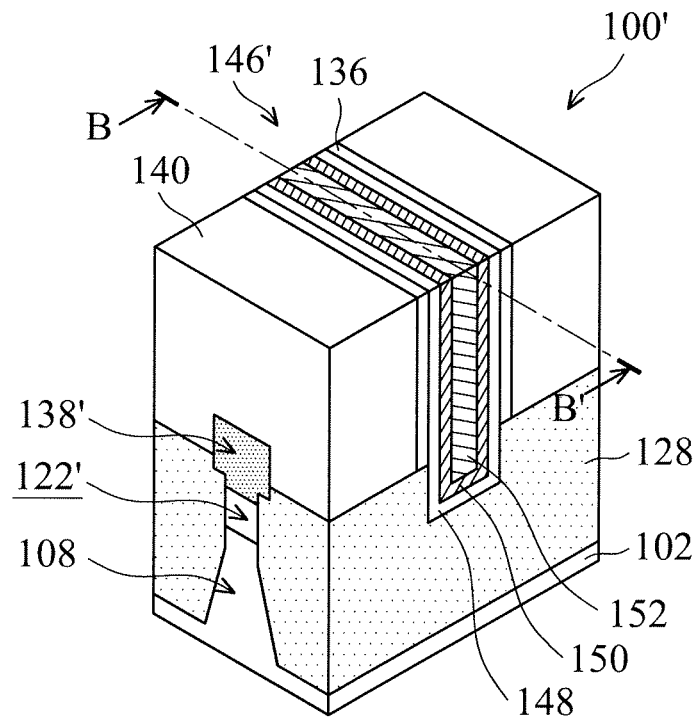

After the dummy gate structure 130 is formed, source/drain regions 138' are formed in two ends of the nanowire structure 126', although only one is shown in FIG. 3D in accordance with some embodiments. As shown in FIG. 3D, the source/drain regions 138' are located over some portions of the cavity 122' and have a narrow bottom portion over the cavity 122'.

After the source/drain regions 138' are formed, the material layer 140 is formed to cover the source/drain regions 138', and a polishing process is performed on the material layer 140 to expose the top surface of the dummy gate structure 130. After the polishing process is performed, the dummy gate structure 130 is removed to form a gate trench between the spacers 136, and a portion of the isolation structure 128 is removed to form an extending portion of the gate trench, similar to those shown in FIG. 1O. In addition, a portion of the cavity 122' is exposed by the extending portion of the gate trench.

Afterwards, a gate structure 146' is formed in the gate trench and the extending portion, as shown in FIG. 3D in accordance with some embodiments. Similar to those shown in 1P, a portion of the gate structure 146' is formed in the cavity 122' located below the nanowire structure 126', such that a portion of the nanowire structure 126' is surrounded by the gate structure 146'. In addition, a portion of the gate structure 146' is formed in the extending portion of the trench formed by removing the dummy gate structure 130 and a portion of the isolation structure 128, such that the portion of the gate structure 146' extends into the isolation structure 128.

In some embodiments, the gate structure 146' includes the gate dielectric layer 148, the work function metal layer 150, and the metal gate electrode layer 152, although additional layers may be formed above and/or below them.

Figure 4:
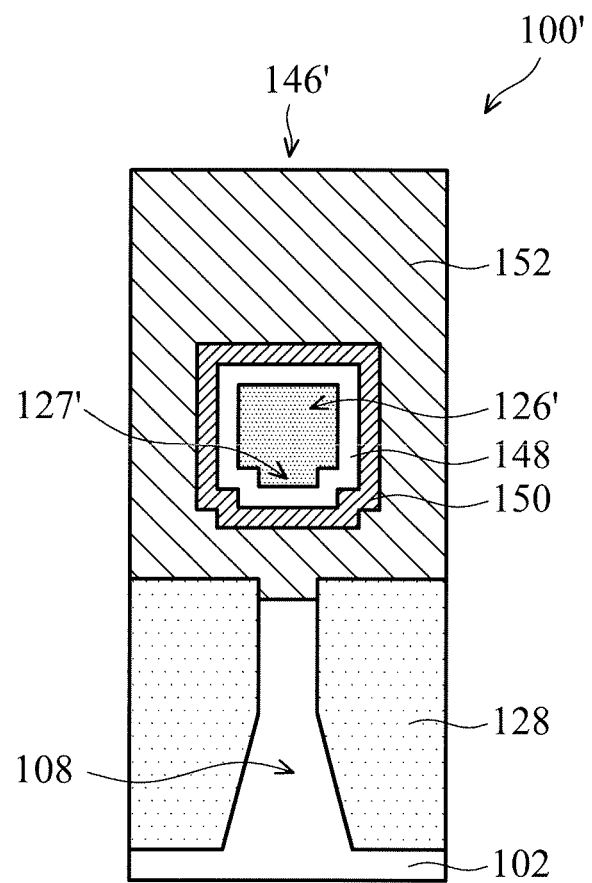
FIG. 4 is a cross-sectional representation of the semiconductor structures shown along line B-B' as shown in FIG. 3D in accordance with various embodiments.

FIG. 4 is a cross-sectional representation of the semiconductor structures 100' shown along line B-B' as shown in FIG. 3D in accordance with various embodiments. The cross-sectional representation shown in FIG. 4 is similar to that shown in FIG. 2A, except that the shape of the nanowire structure 126' is different from that of the nanowire structure 126.

As shown in FIG. 4, the nanowire structure 126' has an extending portion 127', making the bottom portion of the nanowire structure 126' narrower than the top portion of the nanowire structure 126'. In addition, the gate structure 146', including the gate dielectric layer 148, the work function metal layer 150, and the gate electrode layer 152 are conformally formed around the nanowire structure 126', as shown in FIG. 4 in accordance with some embodiments.

It should be noted that, although the cross-sectional representation shown in FIG. 4 is similar to that shown in FIG. 2A, it is merely an example for better understanding the concept of the disclosure. In some other embodiments, the semiconductor structure 100' may have a cross-sectional representation that is different from the one shown in FIG. 4, and it may be similar to the ones shown in FIGS. 2B to 2H.

FIGS. 5A to 5E are perspective representations of various stages of forming a semiconductor structure 100" in accordance with some embodiments. The semiconductor structure 100" is similar to the semiconductor structure 100 described previously, but the shapes of the fin structure, the cavity, and the nanowire structure are different from those shown in FIGS. 1A to 1P in accordance with some embodiments. Some processes and materials used to form the semiconductor structure 100" may be similar to, or the same as, those used to form the semiconductor structure 100 and are not repeated herein.

Figure 5A:
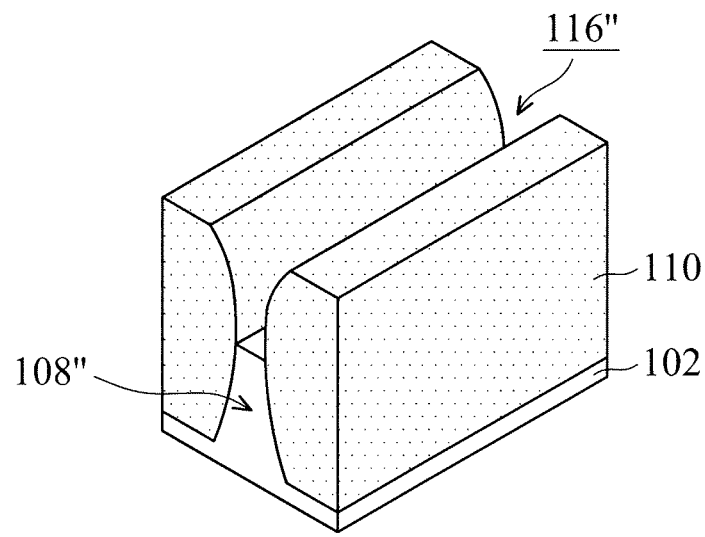
FIGS. 5A to 5E are perspective representations of various stages of forming a semiconductor structure in accordance with some embodiments.

More specifically, a fin structure 108" having curved sidewalls is formed over the substrate 102, as shown in FIG. 5A in accordance with some embodiments. After the fin structure 108" is formed, the insulating layer 110 is formed around the fin structure 108", and a trench 116" is formed in the insulating layer 110 by removing the top portion of the fin structure 108", similar to those shown in FIGS. 1C to 1G and described previously.

Since the fin structure 108" has inwardly curving sidewalls, the trench 116" formed by removing the top portion of the fin structure 108" also has sidewalls that curve inwardly, as shown in FIG. 5A in accordance with some embodiments. That is, the trench 116" has curved sidewalls, and the top portion of the trench 116" is greater than the bottom portion of the trench 116" in accordance with some embodiments.

Figure 5B:
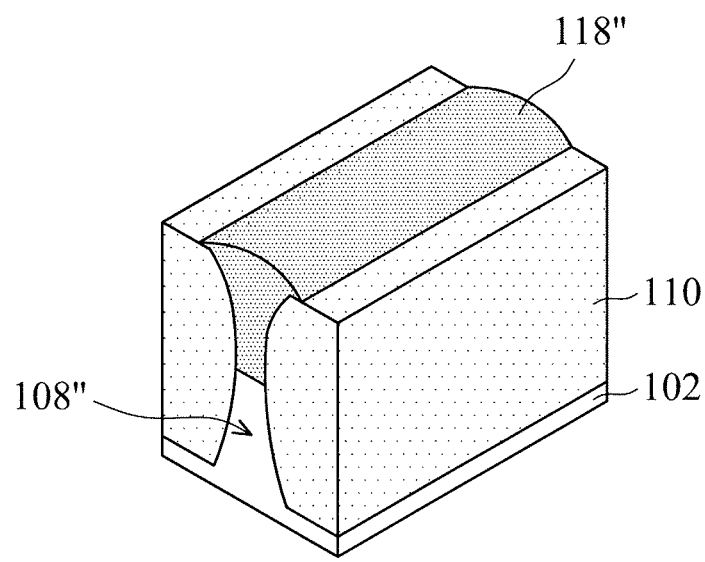

After the trench 116" is formed, the processes shown in FIGS. 1H to 1P may be performed to form the semiconductor structure 100". More specifically, the trench 116" is filled with a semiconductor material 118", as shown in FIG. 5B in accordance with some embodiments.

Figure 5C:
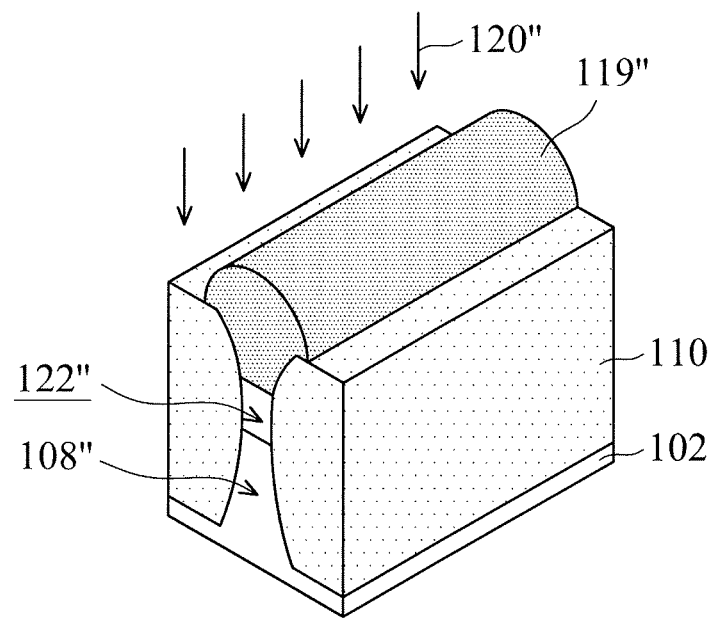
Figure 5D:
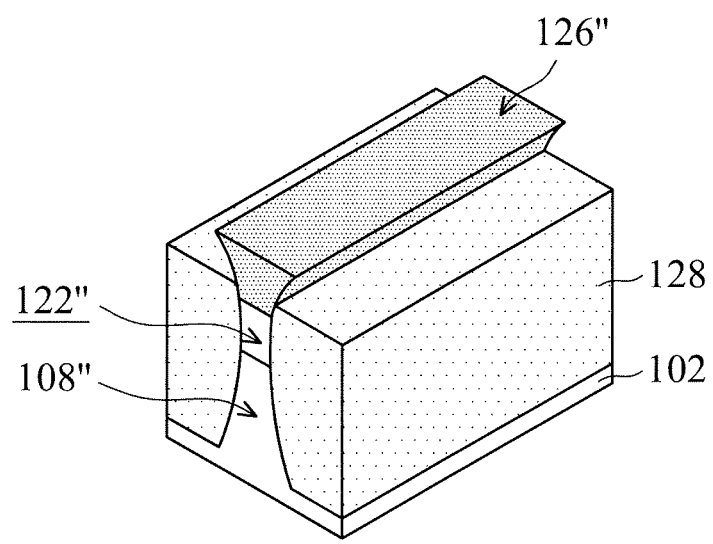

Next, an annealing process 120" is performed to reflow the semiconductor material 118", and a cavity 122" is formed under the reflowed semiconductor material 119", as shown in FIG. 5C in accordance with some embodiments. After the cavity 122" is formed, a polishing process is performed to remove the additional portion of the reflowed semiconductor material 119", and the insulating layer 110 is recessed to form the isolation structure 128. Accordingly, a nanowire structure 126" is formed to have a wide top surface, a narrow bottom surface, and sidewalls that curve inwardly, as shown in FIG. 5D in accordance with some embodiments. In addition, a portion of the nanowire structure 126" is embedded in the isolation structure 128 in accordance with some embodiments.

Figure 5E:
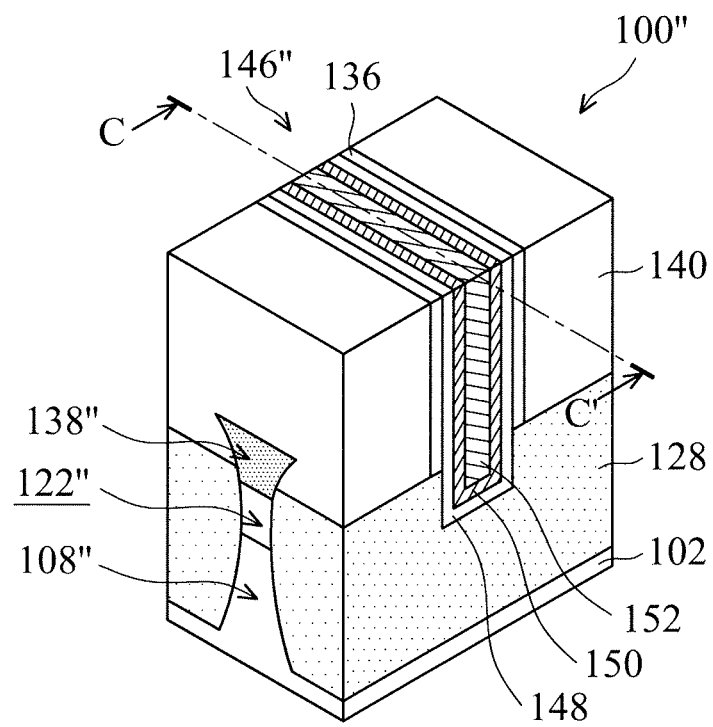

After the nanowire structure 126" is formed, a dummy gate structure may be formed and replaced by a gate structure 146" afterwards, as shown in FIG. 5E in accordance with some embodiments. In addition, source/drain structures 138" are formed in the nanowire structure 126" and are located over the cavity 122".

Figure 6:
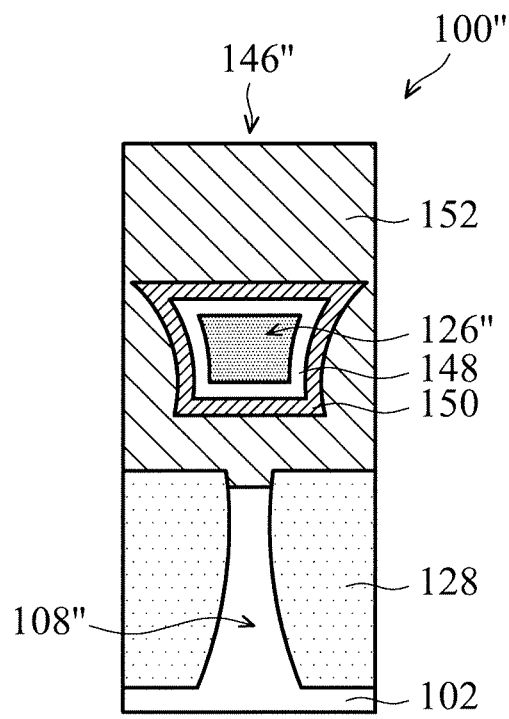
FIG. 6 is a cross-sectional representation of the semiconductor structures shown along line C-C' as shown in FIG. 5E in accordance with various embodiments.

FIG. 6 is a cross-sectional representation of the semiconductor structures 100" shown along line C-C' as shown in FIG. 5E in accordance with various embodiments. The cross-sectional representation shown in FIG. 6 is similar to that shown in FIG. 2A, except that the shape of the nanowire structure 126' is different from that of the nanowire structure 126.

As shown in FIG. 6, the nanowire structure 126" has sidewalls that curve inwardly. In addition, the gate structure 146', including the gate dielectric layer 148, the work function metal layer 150, and the gate electrode layer 152 are conformally formed around the nanowire structure 126", as shown in FIG. 6 in accordance with some embodiments. It should be noted that, although the cross-sectional representation shown in FIG. 6 is similar to that shown in FIG. 2A, it is merely an example for better understanding the concept of the disclosure.

Figure 7:
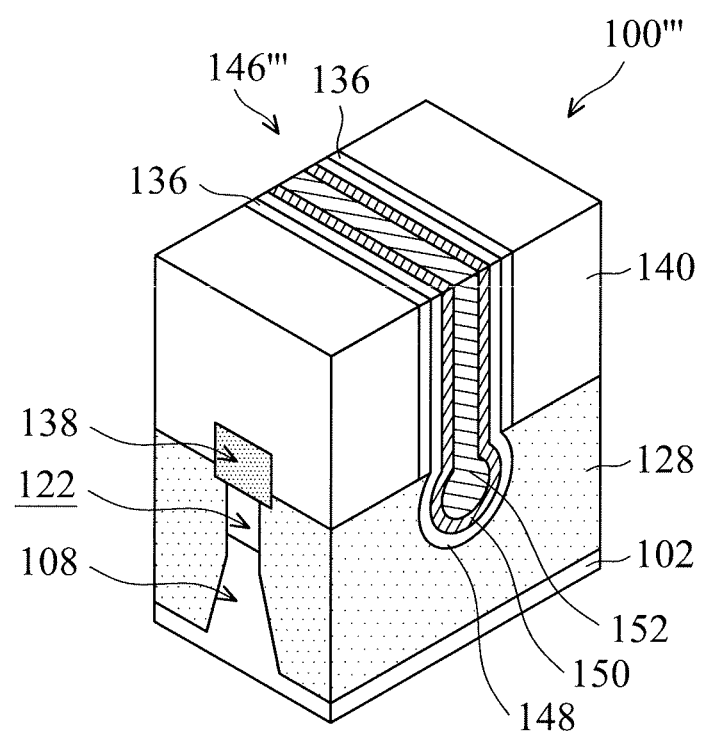
FIG. 7 is a perspective representation of a semiconductor structure in accordance with some embodiments.

FIG. 7 is a perspective representation of a semiconductor structure 100''' in accordance with some embodiments. The semiconductor structure 100''' is similar to the semiconductor structure 100 described previously, except an extending portion of a gate structure 146''' extends under the spacers 136.

More specifically, the processes shown in FIGS. 1A to 1N may be performed. After the dummy gate structure is removed to form a gate trench, an extending portion of the gate trench is formed by removing a portion of the isolation structure 128. In addition, a portion of the extending portion extends under a portion of the spacer 136 in accordance with some embodiments. Afterward, the gate structure 146''' is formed in the gate trench and the extending portion of the gate trench, such that an extending portion of the gate structure 146''' extends under a portion of the spacer 136, as shown in FIG. 7 in accordance with some embodiments.

Figure 8A:
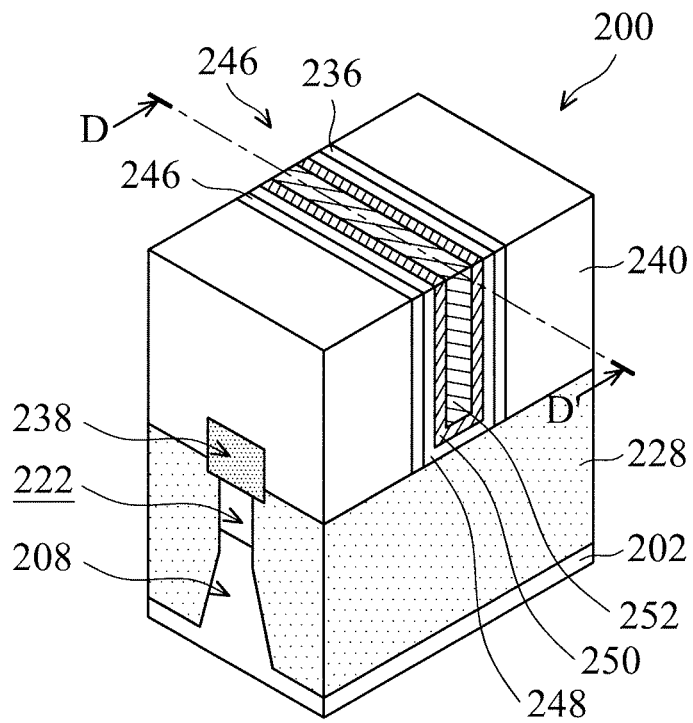
FIG. 8A is a perspective representation of a semiconductor structure in accordance with some embodiments.
Figure 8B:
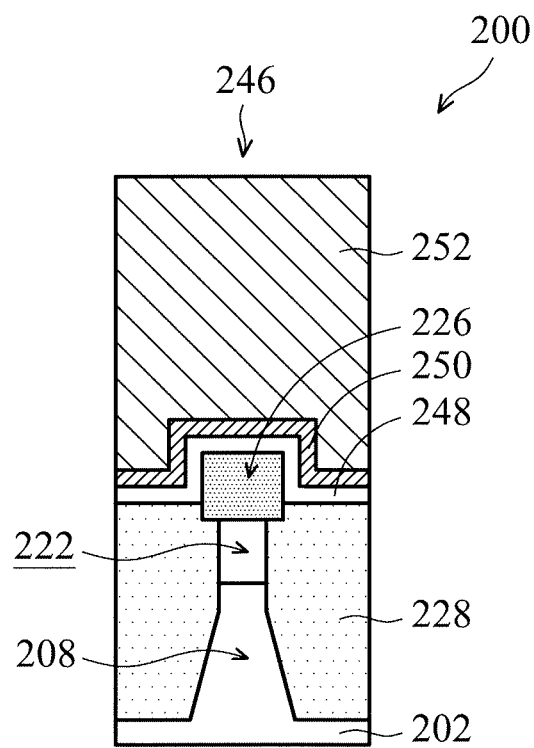
FIG. 8B is a cross-sectional representation of the semiconductor structure shown along line D-D' as shown in FIG. 8A in accordance with some embodiments.

FIG. 8A is a perspective representation of a semiconductor structure 200 in accordance with some embodiments. FIG. 8B is a cross-sectional representation of the semiconductor structure 200 shown along line D-D' as shown in FIG. 8A in accordance with some embodiments. The processes and materials used to form the semiconductor structure 200 are similar to those used to form the semiconductor structure 100 shown in FIGS. 1A to 1P, except that the isolation structure 228 is not etched after the dummy gate structure is removed. The processes and materials that are similar to, or the same as, those described previously are not repeated herein.

More specifically, the processes shown in FIGS. 1A to 1N may be performed. For example, a fin structure 208 may be formed over a substrate 202, and an isolation structure 228 may be formed around the fin structure 208. In addition, a nanowire structure 226 may be formed by filling a semiconductor material in a trench over the fin structure 208 and reflowing the semiconductor material. In addition, after the semiconductor material is reflowed, a cavity 222 is formed under the nanowire structure 226. Afterwards, a dummy gate structure is formed across the nanowire structure 226, and spacers 236, source/drain structures 236, a material layer 240 are formed.

Next, the dummy gate structure is removed, and a gate structure 246 is formed in the trench which is formed by removing the dummy gate structure, as shown in FIG. 7A in accordance with some embodiments. Since the isolation structure 228 is not etched after the dummy gate structure is removed, the cavity 222 will not be exposed. Therefore, when the gate structure 246 is formed, it will only be formed over three sides of the nanowire structure 226 but will not be formed in the cavity 222 under the nanowire structure 226.

Furthermore, since the isolation structure 228 is not etched after the dummy gate structure is removed, the gate structure 246 does not extend into the isolation structure 228. As shown in FIG. 8B, the nanowire structure 226, including the source/drain structures 238 and the portion under the gate structure 246, is separated with the fin structure 208 by the cavity 222 in accordance with some embodiments. That is, a portion of the cavity 222 is located under the gate structure 246, and portions of the cavity 222 are located under the source/drain structures 238 in accordance with some embodiments.

In the semiconductor structure 200 shown in FIG. 8B, although the gate structure 246 is not formed all around the nanowire structure 226, the nanowire structure 226 formed by reflowing the semiconductor material can have a fewer defects therein. In addition, the nanowire structure 226 may have a better isolation with the substrate 202. Therefore, the performance of the semiconductor structure 200 can be improved.

FIGS. 9A to 9D are cross-sectional representations of various stages of forming a semiconductor structure 300 in accordance with some embodiments. Some processes shown in FIGS. 9A to 9D may be similar to, or the same as, those shown in FIGS. 1A to 1J and may not repeated herein.

Figure 9A:
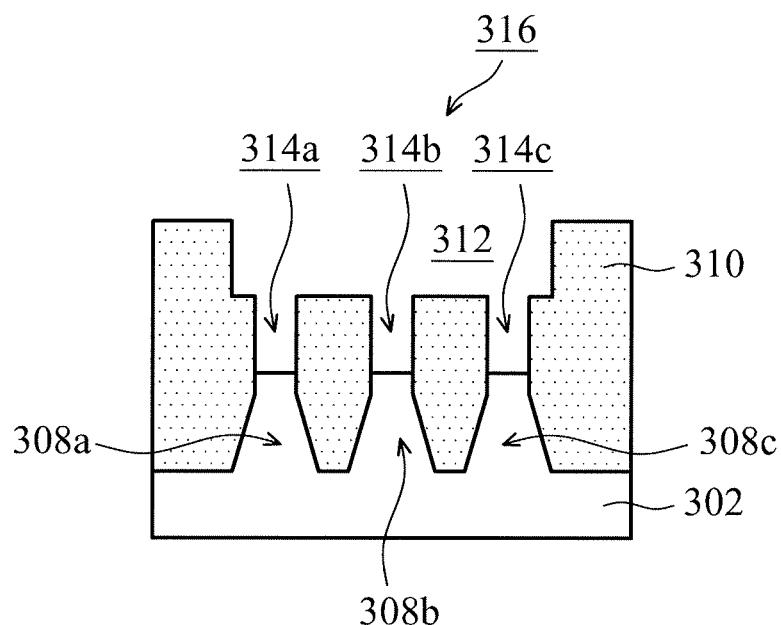
FIGS. 9A to 9D are cross-sectional representations of various stages of forming a semiconductor structure in accordance with some embodiments.

A first fin structure 308a, a second fin structure 308b, and a third fin structure 308c are formed over a substrate 302, and an insulating layer 310 are formed around the first fin structure 308a, the second fin structure 308b, and the third fin structure 308c, as shown in FIG. 9A in accordance with some embodiments.

In addition, a trench 316 is formed in the insulating layer 310 and includes a top portion 312, a first bottom portion 314a, a second bottom portion 314b, and a third bottom portion 314c in accordance with some embodiments. The first bottom portion 314a is located over the first fin structure 308a, and the second bottom portion 314b is located over the second fin structure 308b. Furthermore, the third bottom portion 314c is located over the third fin structure 308c. The trench 316 may be formed by the processes similar to those shown in FIGS. 1A to 1G, except three, instead of one, fin structures are formed.

Figure 9B:
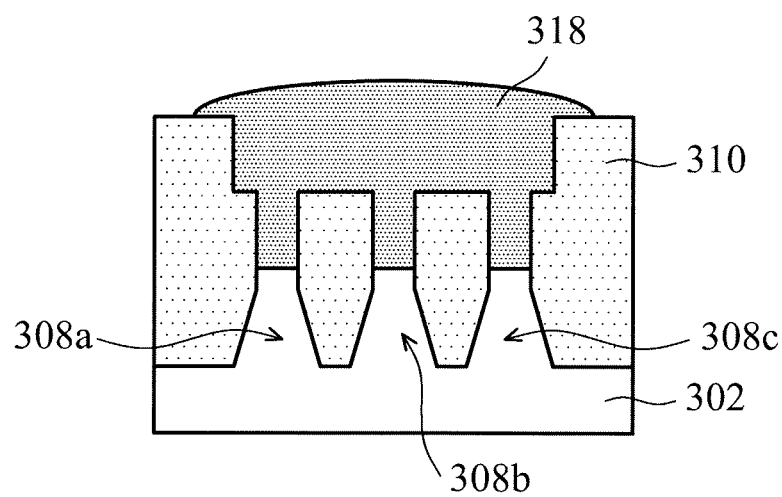

After the trench 316 is formed, a semiconductor material 318 is formed in the trench 316, as shown in FIG. 9B in accordance with some embodiments. The semiconductor material 318 may be similar to, or the same as, the semiconductor material 118 described previously. In some embodiments, the semiconductor material 318 is Ge. In some embodiments, the semiconductor material 318 is formed by performing an epitaxial growing process. In some embodiments, the top portion 312, the first bottom portion 314a, the second bottom portion 314b, and the third bottom portion 314c are all completely filled with the semiconductor material 318.

Figure 9C:
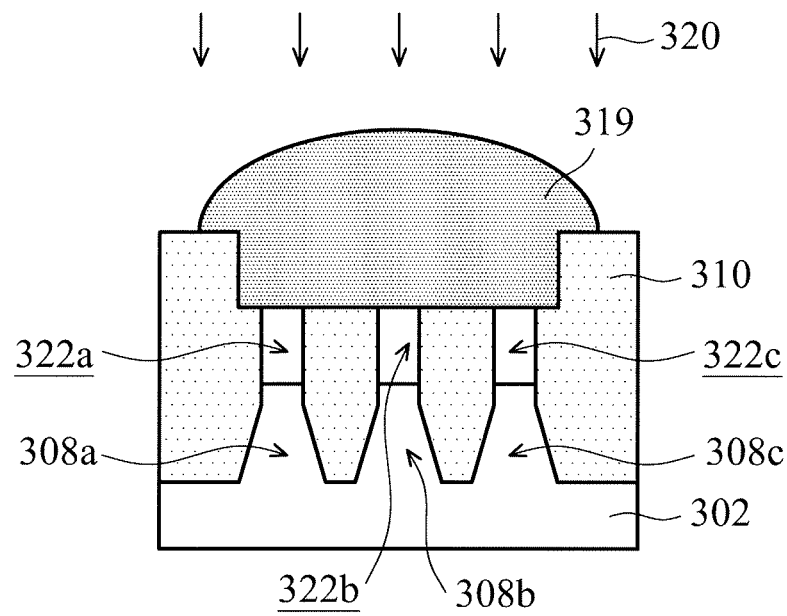

After the semiconductor material 318 is formed, an annealing process 320 is performed to reflow the semiconductor material 318, as shown in FIG. 9C in accordance with some embodiments. The annealing process 320 may be similar to, or the same as, the annealing process 120 described previously.

By performing the annealing process 320, the semiconductor material 318 is reflowed to form a first cavity 322a, a second cavity 322b, and a third cavity 322c under the reflowed semiconductor material 319, as shown in FIG. 9C in accordance with some embodiments. Next, a polishing process is performed to remove the portion of the reflowed semiconductor material 319 formed over the insulating layer 310 to form a nanowire structure 326, as shown in FIG. 9D in accordance with some embodiments.

Figure 9D:
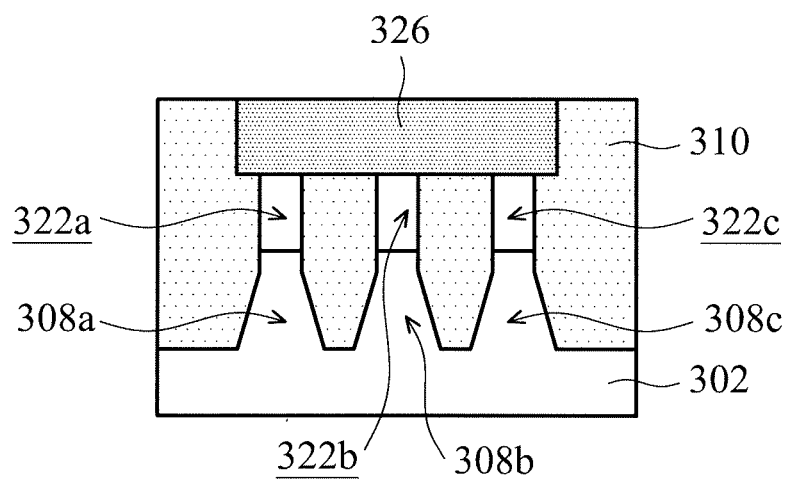

As shown in FIG. 9D, the nanowire structure 326 is separated from the first fin structure 308a, the second fin structure 308b, and the third fin structure 308c by the first cavity 322a, the second cavity 322b, and the third cavity 322c respectively. It should be noted that, although three fin structures and three cavities are shown in FIGS. 9A to 9D, they are merely an example and the numbers of the fin structures and cavities under the nanowire structure 326 is not intended to be limiting.

As described previously, since the nanowire structure 326 is formed by reflowing the semiconductor material 318, the defects in the nanowire structure 326 may be reduced by performing the annealing process 320. In addition, the isolation of the nanowire structure 326 may also be improved. Furthermore, the nanowire structure 326 may be used in various applications, and the usage of the nanowire structure 326 is not intended to be limiting by the examples described above.

In accordance with some embodiments of the disclosure described previously, semiconductor structures (e.g. the semiconductor structure 100, 100', 100'', 100''', 200, and 300) including nanowire structures (e.g. the nanowire structures 126, 126', 126'', 226, and 326) are formed. The nanowire structure may be formed by reflowing a semiconductor material (e.g. the semiconductor material 118, 118'', and 318) in a trench. In addition, a cavity (e.g. the cavities 122, 122', 122'', 222, and 322a to 322c) may be formed under the nanowire structure due to the migration of the semiconductor material during the reflowing process (e.g. the annealing processes 120, 120', 120'', and 320).

In addition, the size of the cavity and the size of the nanowire structure may be controlled by adjusting the size of the trench (e.g. the trench 116, 116'', and 316) and/or adjusting the condition of the annealing process (e.g. the annealing processes 120, 120', 120'', and 320.) The resulting semiconductor structure may be performed according to its application.

Moreover, when the semiconductor material is reflowed, the amounts of the defects, which are formed due to lattice mismatch between the semiconductor material and the substrate, can be reduced. Therefore, the resulting nanowire structure may have fewer defects inside its structure after the reflowing process. Accordingly, the performance of the semiconductor structure may be improved.

Furthermore, since the cavity is formed due to the migration of the semiconductor material during the reflowing process, additional material layers and etching processes are not required. More specifically, although a nanowire structure may be formed by forming a semiconductor material over a sacrificial layer and removing the sacrificial layer to form the nanowire structure, the processes for forming the sacrificial layer and etching the sacrificial layer are required. In addition, the fully removal of the sacrificial layer may be challenging. Therefore, the processes used in the embodiments described above, which includes forming the nanowire structure by reflowing the semiconductor material, are less complicated, and the resulting nanowire structure may have better isolation.

Embodiments of a semiconductor structure and methods for forming the same are provided. The semiconductor structure includes a nanowire structure. The nanowire structure is formed by reflowing a semiconductor material formed in the trench, so that a cavity can be formed at the bottom of the trench under the reflowed semiconductor material. After the reflowing process, the amounts of defects in the semiconductor material can be reduced, and therefore the defects in the resulting nanowire structure can be reduced. Accordingly, the performance of the semiconductor structure may be improved.

In some embodiments, a semiconductor structure is provided. The semiconductor structure includes a fin structure formed over a substrate and an isolation structure formed around the fin structure. The semiconductor structure further includes a nanowire structure formed over the fin structure and a gate structure formed around the nanowire structure. In addition, a bottommost of the nanowire structure is lower than a top surface of the isolation structure.

In some embodiments, a semiconductor structure is provided. The semiconductor structure includes a fin structure formed over a substrate and an isolation structure formed around the fin structure. The semiconductor structure further includes a nanowire structure formed over the fin structure and a gate structure formed around the nanowire structure. In addition, a source/drain structure formed in the nanowire structure adjacent to the gate structure, wherein a cavity is located under the source/drain structure.

In some embodiments, a semiconductor structure is provided. The semiconductor structure includes a fin structure formed over a substrate and an isolation structure formed around the fin structure. The semiconductor structure further includes a nanowire structure formed over the fin structure and a gate structure formed around the nanowire structure. The semiconductor structure further includes a spacer formed on a sidewall of the gate structure and a source/drain structure formed in the nanowire structure adjacent to the gate structure. In addition, the source/drain structure and the fin structure are separated by a cavity.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
a fin structure formed over a substrate;
an isolation structure formed around and covering a sidewall of the fin structure;
a nanowire structure formed over and vertically overlapping the fin structure;
a gate structure formed around the nanowire structure and covering a top surface of the isolation structure; and
a spacer formed on a sidewall of the gate structure,
wherein a bottommost portion of the nanowire structure is lower than the top surface of the isolation structure, and an upper portion of the sidewall of the gate structure is covered by the spacer, and a bottom portion of the sidewall of the gate structure is covered by the isolation structure.

2. The semiconductor structure as claimed in claim 1, wherein the nanowire structure and the fin structure are separated by a cavity.

3. The semiconductor structure as claimed in claim 1, further comprising:
a source/drain structure formed in the nanowire structure, wherein a cavity is located under the source/drain structure.

4. The semiconductor structure as claimed in claim 3, wherein a bottom surface of the source/drain structure is exposed by the cavity.

5. The semiconductor structure as claimed in claim 3, wherein the cavity extends under the gate structure.

6. A semiconductor structure, comprising:
a fin structure formed over a substrate;
an isolation structure formed around and in direct contact with the fin structure;
a nanowire structure formed over the fin structure;
a gate structure formed around and in direct contact with the nanowire structure and extending over the isolation structure, wherein the gate structure has an unlevel bottom surface; and
a source/drain structure formed in the nanowire structure adjacent to the gate structure, wherein a cavity is located under the source/drain structure.

7. The semiconductor structure as claimed in claim 6, wherein the cavity extends under the gate structure.

8. The semiconductor structure as claimed in claim 6, wherein a bottommost portion of the nanowire structure is lower than a top surface of the isolation structure.

9. The semiconductor structure as claimed in claim 6, wherein a bottommost portion of the gate structure is lower than a top surface of the isolation structure.

10. The semiconductor structure as claimed in claim 6, wherein the nanowire structure has a wider top portion and a narrower bottom portion.

11. A semiconductor structure, comprising:
a fin structure formed over a substrate;
an isolation structure formed around the fin structure;
a nanowire structure formed over the fin structure;
a gate structure formed around the nanowire structure, wherein a portion of the gate structure is sandwiched between the nanowire structure and the fin structure;
a spacer formed on a sidewall of the gate structure; and
a source/drain structure formed in the nanowire structure adjacent to the gate structure,
wherein the source/drain structure and the fin structure are completely separated from each other, and the source/drain structure is partially embedded in the isolation structure.

12. The semiconductor structure as claimed in claim 11, wherein a bottommost portion of the source/drain structure is lower than a top surface of the isolation structure.

13. The semiconductor structure as claimed in claim 11, wherein the gate structure extends directly below the spacer.

14. The semiconductor structure as claimed in claim 11, wherein the nanowire structure has a wider top portion and a narrower bottom portion.

15. The semiconductor structure as claimed in claim 11, wherein a width of the nanowire structure is greater than a width of the fin structure.

16. The semiconductor structure as claimed in claim 1, wherein a portion of the gate structure extends below the nanowire structure and is sandwiched between the nanowire structure and the isolation structure.

17. The semiconductor structure as claimed in claim 1, wherein the spacer vertically overlaps a portion of the gate structure.

18. The semiconductor structure as claimed in claim 1, wherein the isolation structure is in direct contact with the bottom portion of the sidewall and a bottom surface of the gate structure.

19. The semiconductor structure as claimed in claim 1, wherein the isolation structure is made of oxide.

20. The semiconductor structure as claimed in claim 11, wherein the gate structure vertically overlaps the nanowire structure and the fin structure.

* * * * *